United States Patent
Toki

[19]

[11] Patent Number: 5,994,973
[45] Date of Patent: Nov. 30, 1999

[54] PWM DRIVER

[75] Inventor: Nozomi Toki, Tokyo, Japan

[73] Assignee: NEC Corporation, Tokyo, Japan

[21] Appl. No.: 09/067,388

[22] Filed: Apr. 28, 1998

[30] Foreign Application Priority Data

Apr. 28, 1997 [JP] Japan .................................... 9-111158

[51] Int. Cl.⁶ .................................................. H03K 7/08
[52] U.S. Cl. .......................... 332/109; 375/238; 327/175
[58] Field of Search ..................... 332/109–111; 375/238,
375/242–254; 327/175; 340/384.7; 381/28

[56] References Cited

U.S. PATENT DOCUMENTS

| | | | |
|---|---|---|---|
| 3,715,649 | 2/1973 | Ravas | 321/45 R |
| 4,882,664 | 11/1989 | Pennington | 363/41 |
| 4,914,396 | 4/1990 | Berthiaume | 328/14 |
| 4,931,713 | 6/1990 | Matjukhina et al. | 318/632 |

FOREIGN PATENT DOCUMENTS

| | | |
|---|---|---|
| 56-156019 | 12/1981 | Japan . |
| 59-37731 | 3/1984 | Japan . |
| 2-250528 | 10/1990 | Japan . |
| 3-13118 | 1/1991 | Japan . |
| 4-105564 | 4/1992 | Japan . |
| 5-56656 | 3/1993 | Japan . |

*Primary Examiner*—David Mis
*Attorney, Agent, or Firm*—Scully, Scott, Murphy and Presser

[57] ABSTRACT

Disclosed is a PWM driver in which, when no signal is input, a PWM pulse wave is not output so as to thereby reduce a power to be consumed and a high output level can be obtained even by the use of a single-polarity power source. Also, provided is a PWM driver capable of changing an output amplitude by a simple circuit. For this purpose, a PWM driving apparatus for supplying a power proportional to an input signal to a load by outputting a PWM pulse wave whose duty cycle is changed in proportion to the input signal, comprises: a PWM modulator for outputting a first PWM pulse having a pulse width proportional to an absolute value of the input signal in a predetermined cycle; an inverting amplifier for outputting a second PWM pulse having a polarity opposite to the polarity of the first PWM pulse; switch means for outputting the first PWM pulse or the second PWM pulse in response to the polarity of the input signal; and an amplifier for outputting the PWM pulse wave in response to an output pulse of the switch means.

4 Claims, 6 Drawing Sheets

PWM DRIVER

BACKGROUND OF THE INVENTION

1. Field of the Invention

The present invention relates to a PWM (Pulse Width Modulation) driver for driving a speaker, a ringer or the like for use in a portable device such as a portable telephone driven by a battery.

2. Description of the Prior Arts

In a conventional PWM driver, when a power source has a positive polarity alone (the power source having a single polarity), since a circuit is operated even when no signal is input, a power is wasted. That is, a PWM pulse wave of a duty cycle of 50% or more is output when the input signal has the positive polarity, while the PWM pulse wave of the duty cycle of 50% or less is output when the input signal has a negative polarity, and the PWM pulse wave of the duty cycle of 50% is output when no signal is input.

Furthermore, since an output signal of such a PWM driver is subject to DC offset, a capacitor for cutting off a direct-current component is required to drive a speaker or the like.

Therefore, Japanese Patent Application Laid-open No. 56-156019 proposes a PWM driver wherein the positive-polarity PWM pulse wave is output in response to the positive-polarity input signal, the negative-polarity PWM pulse wave is output in response to the negative-polarity input signal and for setting the PWM pulse wave is set to 0 at the time of no input signal.

On the other hand, Japanese Patent Application Laid-open No. 59-37731 proposes the PWM driver comprising two counters for generating the PWM pulse from PCM data in response to the positive polarity and the negative polarity, wherein each counter outputs the PWM pulse proportional to an absolute value of the input signal, whereby it is not necessary to input a code bit to the counters, so that a clock frequency is reduced in rate.

However, the PWM driver described in Japanese Patent Application Laid-open No. 56-156019 of the above-described conventional PWM driver faces such problem that, since this apparatus needs the power source of both of the positive and negative polarities, it cannot be used for a portable device which generally uses the single-polarity power source and reduces a voltage.

On the other hand, since the PWM driver described in Japanese Patent Application Laid-open No. 59-37731 needs two counters for outputting the PWM pulse, it is difficult to employ this apparatus for the portable device which is advanced in miniaturization and in reduction of the power to be consumed.

Moreover, as described above, since the portable device generally uses the single-polarity power source and reduces the voltage, when the speaker or the like is driven by the single-polarity power source, it is difficult to obtain a high output level.

In addition, for example, in case the PWM pulse wave is obtained from 2's complement PCM data, if an attempt is made to change the output level by a volume or the like, since it is necessary to perform a digital processing by a multiplier, an adder or the like, a problem is caused in which the circuit is complicated.

SUMMARY OF THE INVENTION

The present invention is made in order to solve the above-described problems of the prior arts. It is an object of the present invention to provide a PWM driver in which, when no signal is input, a PWM pulse wave is not output so as to thereby reduce a power to be consumed and a high output level can be obtained even by the use of a single-polarity power source. It is another object of the present invention to provide a PWM driving apparatus capable of changing the output level by a simple circuit.

In order to achieve the above objects, according to the present invention, there is provided a PWM driver for supplying a power proportional to an input signal to a load by outputting a PWM pulse wave whose duty cycle is changed in proportion to the input signal, which comprises: a PWM modulator for outputting a first PWM pulse having a pulse width proportional to an absolute value of the input signal in a predetermined cycle; an inverting amplifier for outputting a second PWM pulse having a polarity opposite to the polarity of the first PWM pulse; switch means for outputting the first PWM pulse or the second PWM pulse in response to the polarity of the input signal; and an amplifier for outputting the PWM pulse wave in response to an output pulse of the switch means.

In this case, the amplifier may be a differential output amplifier for outputting a first PWM pulse wave obtained by non-inverting the output pulse of the switch means and for outputting a second PWM pulse wave obtained by inverting the output pulse of the switch means.

The PWM driver may further comprise a clock generator for providing the PWM modulator with a sampling clock which is set to an optional frequency and is for determining a predetermined cycle and a counter clock which is set to the frequency in response to the number of quantized bits of the input signal in accordance with the frequency of the sampling clock and is used by counting means for allowing the first PWM pulse to have the pulse width proportional to the absolute value of the input signal.

The PWM driver may further comprise: a counter for outputting a timing pulse for determining a leading-edge timing of the first PWM pulse; and a level control circuit for setting a count value for allowing the counter to output the timing pulse so that the count value may be changeable.

In the PWM driver constituted as described above, the switch means outputs a positive-polarity PWM pulse (the first PWM pulse) or a negative-polarity PWM pulse (the second PWM pulse) in response to the polarity of the input signal, the PWM pulse is not output when no signal is input, and thus the power is not wasted.

Furthermore, the amplifier is the differential output amplifier for outputting the first PWM pulse wave obtained by non-inverting the output pulse of the switch means and for outputting the second PWM pulse wave obtained by inverting the output pulse of the switch means. Thus, an output amplitude is two times the output amplitude of an application of either the first or second PWM pulse wave to the load, so that a DC offset is eliminated.

Moreover, the driver comprises the clock generator for providing the PWM modulator with the sampling clock of an optional frequency and the counter clock of the corresponding frequency. Thus, the apparatus can also comply with PCM data of various numbers of quantized bits.

Additionally, the driver comprises the counter for outputting the timing pulse for determining the leading-edge timing of the first PWM pulse; and the level control circuit for setting the count value for allowing the counter to output the timing pulse so that the count value may be changeable. Thus, the pulse width of the PWM pulse wave can be easily varied by the count value which is set by the level control circuit.

DETAILED DESCRIPTION OF THE PREFERRED EMBODIMENTS

The present invention will be described below with reference to the accompanying drawings.

Figure 1:
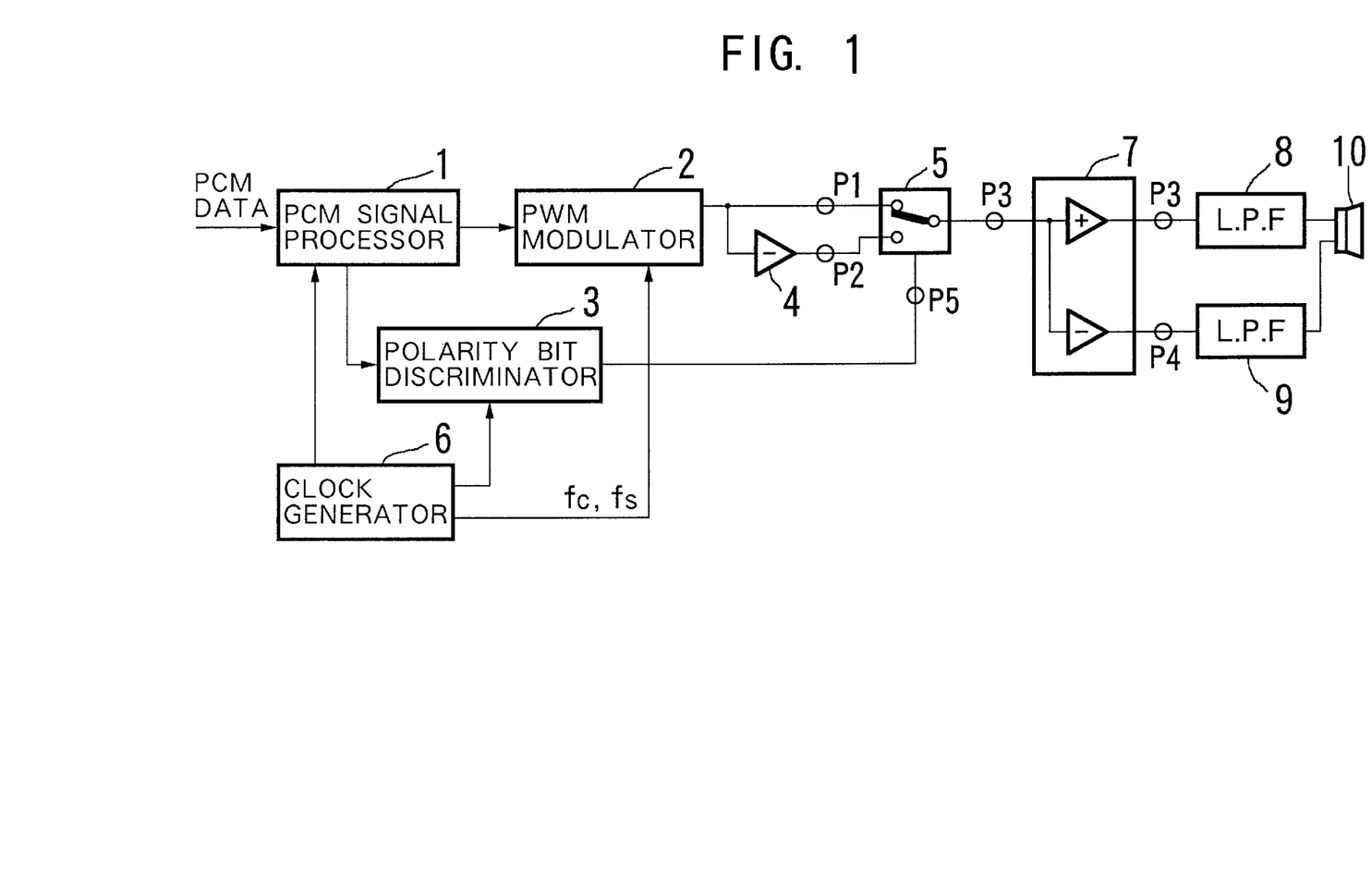
FIG. 1 is a block diagram showing a constitution of a PWM driver according to the present invention.
Figure 2:
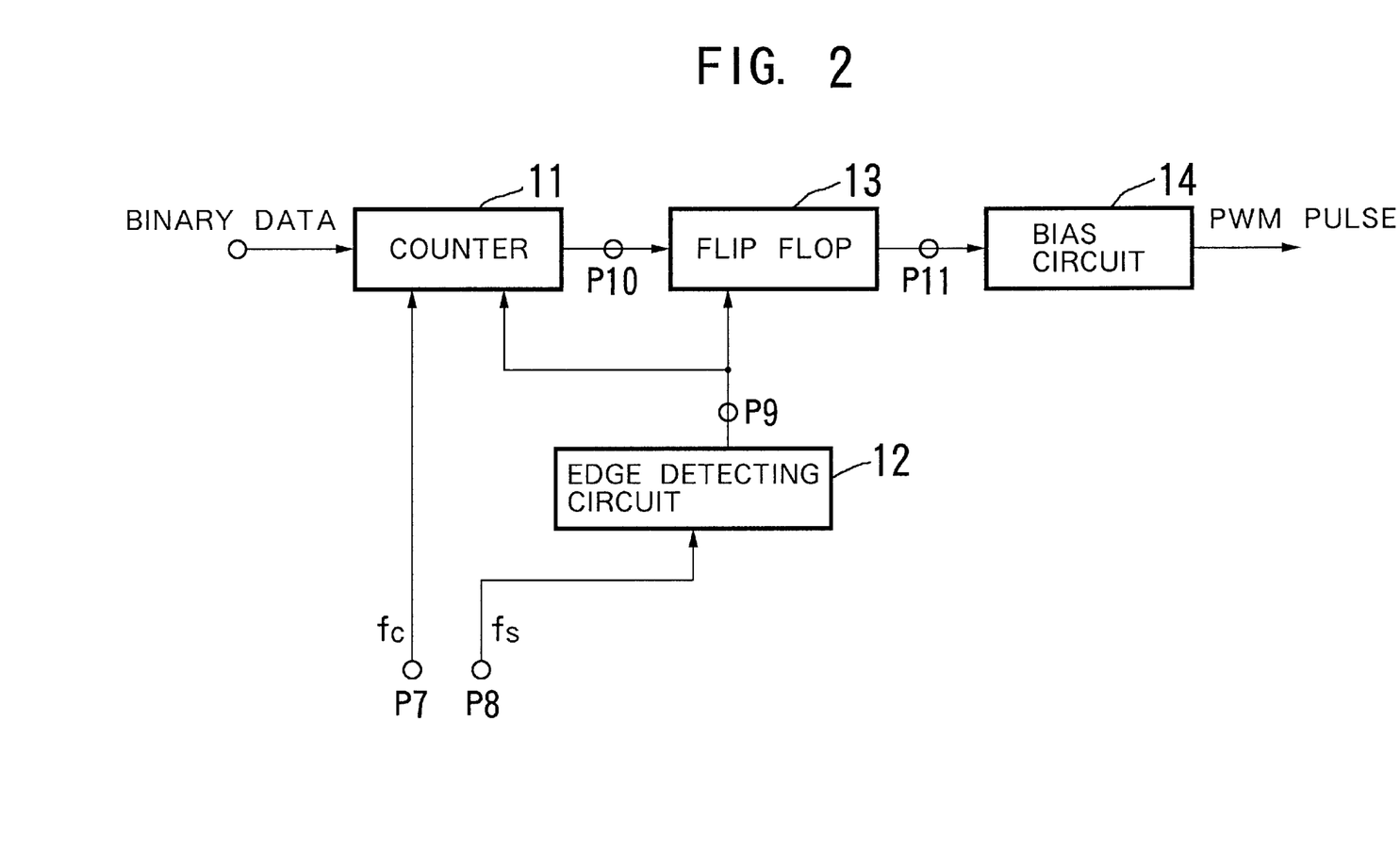
FIG. 2 is a block diagram showing the constitution of a first embodiment of a PWM modulator shown in FIG. 1.

FIG. 1 is a block diagram showing a constitution of a PWM driver according to the present invention. FIG. 2 is a block diagram showing the constitution of a first embodiment of a PWM modulator shown in FIG. 1.

In FIG. 1, the PWM driver comprises a PCM signal processor 1 for reading an input signal including n-bit 2's complement PCM data; a PWM modulator 2 for outputting a PWM pulse of a pulse width proportional to an absolute value of the input signal; a polarity bit discriminator 3 for detecting the polarity of the input signal from a code bit of the PCM data input to the PCM signal processor 1 and for outputting a switching pulse for controlling a polarity switch as described below in a sampling cycle of the PCM data; an inverting amplifier 4 for outputting the PWM pulse having the polarity opposite to the polarity of the PWM pulse output from the PWM modulator 2; a clock generator 6 including a multiplier or a frequency divider and for outputting an optional sampling clock fs and a counter clock fc equal to $2^{n-1}$ times the sampling clock fs; a polarity switch 5 for outputting either the output pulse of the PWM modulator 2 or the output pulse of the inverting amplifier 4 in response to a switching signal from the polarity bit discriminator 3; a differential output amplifier 7 for outputting a non-inverted pulse and an inverted pulse which are obtained by non-inverting and inverting the PWM pulse output from the polarity switch 5, respectively; and a first low-pass filter 8 and a second low-pass filter 9 for smoothing the PWM pulse wave output from the differential output amplifier 7.

The signals output from the first low-pass filter 8 and the second low-pass filter 9 are applied to a speaker 10.

The PCM signal processor 1 outputs binary data corresponding to an amplitude value of the input signal except for the code bit (MSB) in the PCM data which is the input signal. The binary data is output as parallel data which is converted in serial/in parallel by a shift register (not shown) of the PCM signal processor 1. At this time, referring to code data, if the polarity of the input signal is positive, the PCM signal processor 1 latches the parallel data. On the other hand, if the polarity of the input signal is negative, the PCM signal processor 1 inverts each bit, adds 1 to each bit and latches each bit. By such an inversion, the latched parallel data (binary data) is the value proportional to the amplitude, even if the polarity of the input signal is negative.

The PWM modulator 2 outputs the PWM pulse of the pulse width proportional to the binary data output from the PCM signal processor 1. At this time, the PWM pulse output from the PWM modulator 2 has a duty cycle of 100% when the input signal is at full-scale level, while the PWM pulse has the duty cycle of 0% when no signal is input.

When the PWM driver has a single-polarity power source, the inverting amplifier 4 and the differential output amplifier 7 include a bias circuit for biasing the voltage of ½ of a source voltage.

In FIG. 2, the PWM modulator 2 comprises a counter 11 for counting by the counter clock fc output from the clock generator 6; a flip flop 13 for outputting the PWM pulse of the pulse width proportional to the absolute value of the input signal; and an edge detecting circuit 12 for outputting a timing pulse for resetting the counter 11 and setting the flip flop 13.

A bias circuit 14 is the circuit for supplying a direct-current bias to the PWM pulse output from the flip flop 13, and the bias circuit 14 is needed when the PWM driving apparatus has the single-polarity power source. In this case, a bias value is set to the voltage of ½ of the source voltage.

In such a constitution, an operation of the PWM driver of this embodiment will be described below with reference to FIGS. 3 and 4.

FIG. 3 is a timing chart showing an operation mode of the PWM driver shown in FIG. 1. FIG. 4 is a timing chart showing the operation mode of the PWM modulator shown in FIG. 2.

Figure 3A:
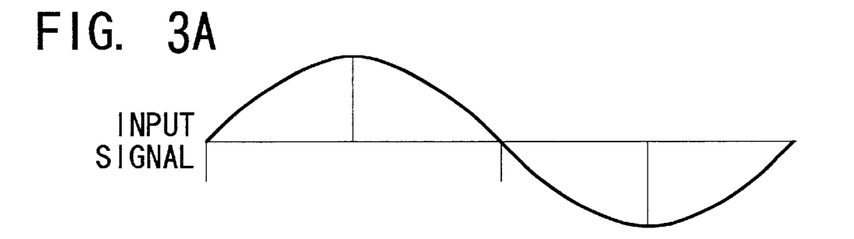
FIGS. 3A–3G is a timing chart showing an operation mode of the PWM driver shown in FIG. 1.
Figure 3B:
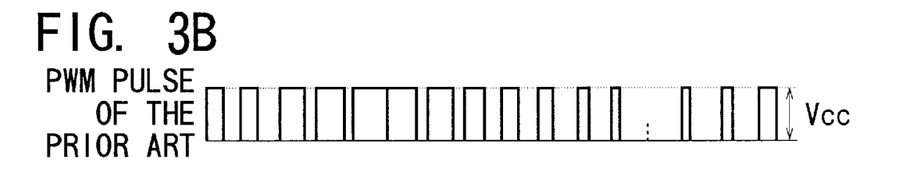

In FIG. 3, when a sine wave is input at full-scale level as the input signal (see FIG. 3(A)), the PWM pulse wave output from the conventional PWM driver has the duty cycle of 100% when the input signal has the maximum amplitude of the positive polarity, the PWM pulse wave has the duty cycle of 0% when the input signal has the maximum amplitude of the negative polarity, and the PWM pulse wave has the duty cycle of 50% when no signal is input (see FIG. 3(B)).

Figure 3C:
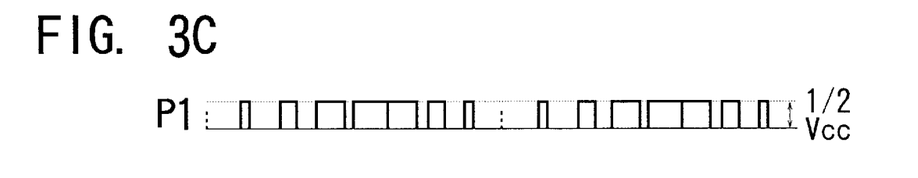

On the other hand, in the PWM driver of this embodiment, the PWM modulator 2 outputs a PWM pulse P1 of the pulse width proportional to the absolute value of the input signal (see FIG. 3(C)). The inverting amplifier 4 outputs a PWM pulse P2 having the polarity opposite to the polarity of the PWM pulse P1 (see FIG. 3(D)).

Figure 3D:
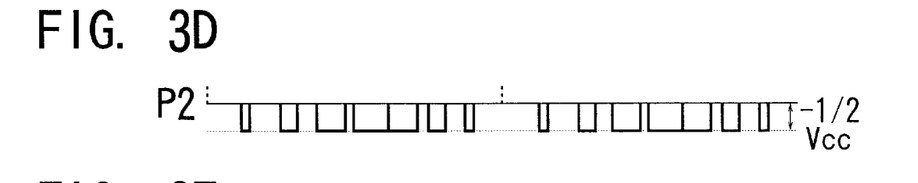

The polarity switch 5 outputs either the PWM pulse P1 or the PWM pulse P2 in accordance with a switching signal P5 sent from the polarity bit discriminator 3. At this time, the polarity switch 5 outputs the PWM pulse whose polarity is switched in response to the polarity of the input signal, both of the positive-polarity and negative-polarity PWM pulses having the pulse width proportional to the amplitude of input signal.

Figure 3E:
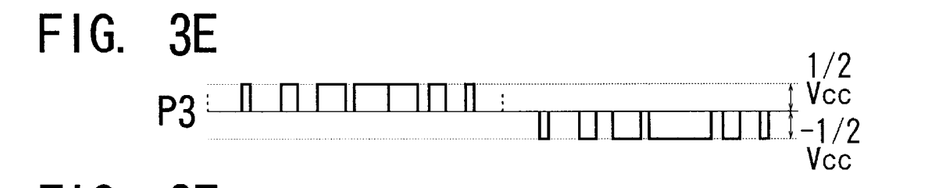
Figure 3F:
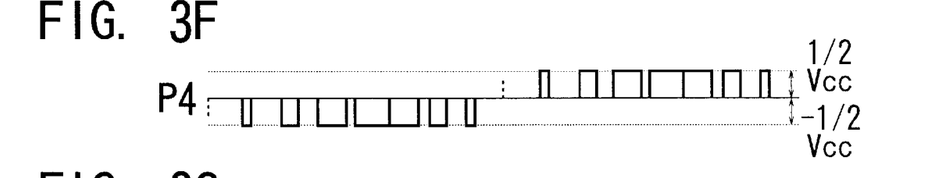

The differential output amplifier 7 also outputs a PWM pulse wave P3 (see FIG. 3(E)) and a PWM pulse wave P4 (see FIG. 3(F)) which are obtained by non-inverting and inverting the PWM pulse output from the polarity switch 5, respectively.

Figure 3G:
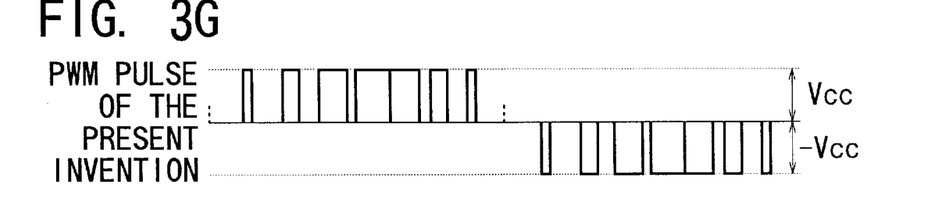

Therefore, as shown in FIG. 3(G), a pulse string whose amplitude value is two times the amplitude value of the PWM pulse wave P3 or the PWM pulse wave P4 is output between two output terminals of the differential output amplifier 7. The PWM pulse wave P3 and the PWM pulse wave P4 output from the differential output amplifier 7 are smoothed by the first low-pass filter 8 and the second low-pass filter 9, respectively. Then, the PWM pulse waves P3 and P4 are converted into an analog signal and applied to the speaker 10.

Figures 4A, 4B, 4C:
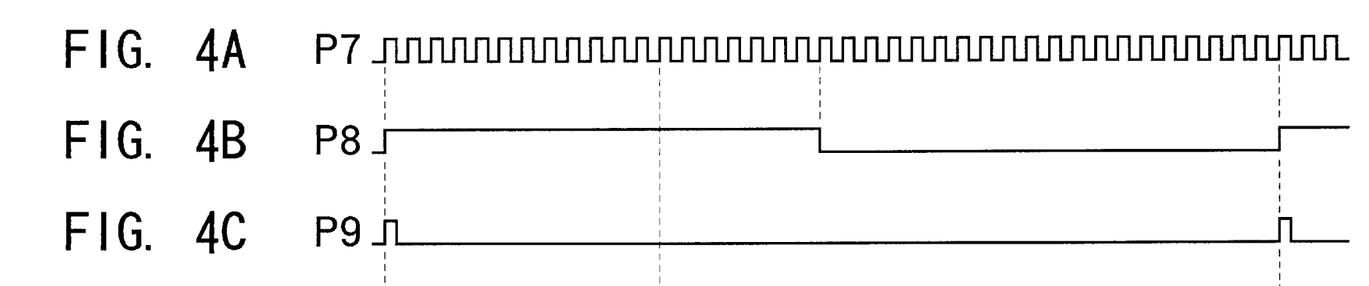
FIGS. 4A–4E is a timing chart showing the operation mode of the PWM modulator shown in FIG. 2.

In FIG. 4, the counter clock fc (P7) shown in FIG. 4(A) and the sampling clock fs (P8) shown in FIG. 4(B) are input to the PWM modulator 2. The edge detecting circuit 12 detects a leading edge of the sampling clock fs (see FIG. 4(C)) and outputs a timing pulse P9 for resetting the counter 11 and setting the flip flop 13. The counter clock fc is $2^{n-1}$ times the sampling clock fs and is used for the counting operation of the counter 11.

Figures 4D, 4E:
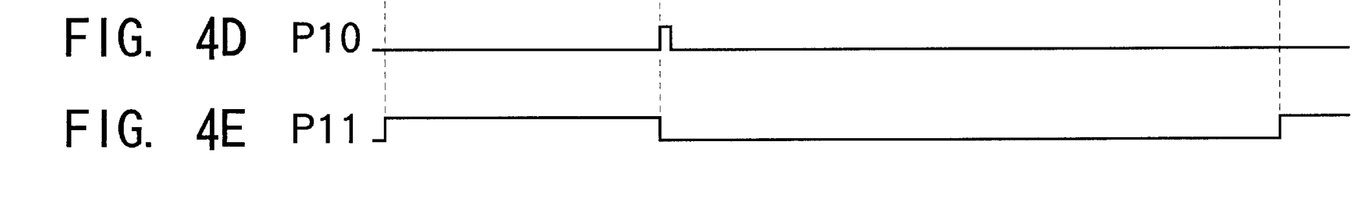

As shown in FIG. 4(D), the counter 11 operates to count by the use of the counter clock fc in accordance with the binary data output from the PCM signal processor 1. As soon as the count is completed, the counter 11 outputs a counter completion pulse P10. The counting operation is started by inputting the timing pulse P9 output from the edge detecting circuit 12.

The flip flop 13 sets the data "1" by the timing pulse P9 output from the edge detecting circuit 12 and resets the data "1" by the count completion pulse P10 output from the counter 11. Therefore, the flip flop 13 outputs a PWM pulse P11 (see FIG. 4(E)) having the pulse width from the time of outputting the timing pulse P9 to the time of outputting the count completion pulse P10. This pulse width is proportional to the amplitude of the input signal (PCM data) in one sample cycle.

The PWM pulse P1 output from the PWM modulator 2 has the duty cycles of 100% and 0% when the input signal has the maximum and minimum amplitudes, respectively.

Therefore, in the PWM driver of this embodiment, since the PWM pulse wave is not output when no signal is input, the waste of the power can be avoided when no signal is input. Furthermore, since the output has no DC offset, when the speaker or the like is driven, a capacitor for cutting off a direct current is not required.

Moreover, in the conventional PWM driver, since the PWM pulse wave whose duty cycle is 50% is output even when no signal is input, the variation in the amplitude of the PWM pulse wave due to the variation in the source voltage causes a noise to be output from the low-pass filter. On the other hand, according to the present invention, since the PWM pulse wave is not output when no signal is input, the noise is not output from the low-pass filter. Therefore, a noise level is lowered when no signal is input.

Furthermore, the PWM pulse wave is output by the differential output amplifier, whereby the output amplitude is two times the output amplitude of the application of either PWM pulse wave alone to the speaker 10, and thus the high output level can be obtained from the PWM driving apparatus. In addition, since the differential output amplifier performs the switching operation alone, efficiency is higher than the efficiency in case of processing the analog signal.

On the other hand, assuming that the number of quantized bits of the PCM data processed by this embodiment is defined as m, if there are provided an m-1 bit binary counter and a clock generator for generating the clock of the frequency which is $2^{m-1}$ times the sampling clock fs which is set to an optional frequency, the apparatus can also comply with the PCM data of various numbers of quantized bits which are m or less.

In such a manner, the processible number of quantized bits of the PCM data depends on the frequency of the counter clock fc of the counter 11, but it does not depend on precision of a hardware unlike a D/A converter using a typical ladder-type resistor network. Although the maximum number of bits of the PCM data is limited by the maximum operating frequency of the counter 11, since this frequency is $2^{m-1}$ times the sampling clock fs, a half frequency is sufficient in comparison to the conventional PWM driving apparatus requiring the $2^m$ times counter clock fc. Accordingly, the frequency of the sampling clock fs and the number m of quantized bits can be higher than the maximum operating frequency of the counter 11 in comparison to the prior art.

A second embodiment of the present invention will be described below with reference to FIGS. 5 and 6.

Although the PWM driver of the second embodiment is different from that of the first embodiment in the constitution of the PWM modulator, since the first and second embodiments are the same as each other in the other constitutions, the description is omitted.

Figure 5:
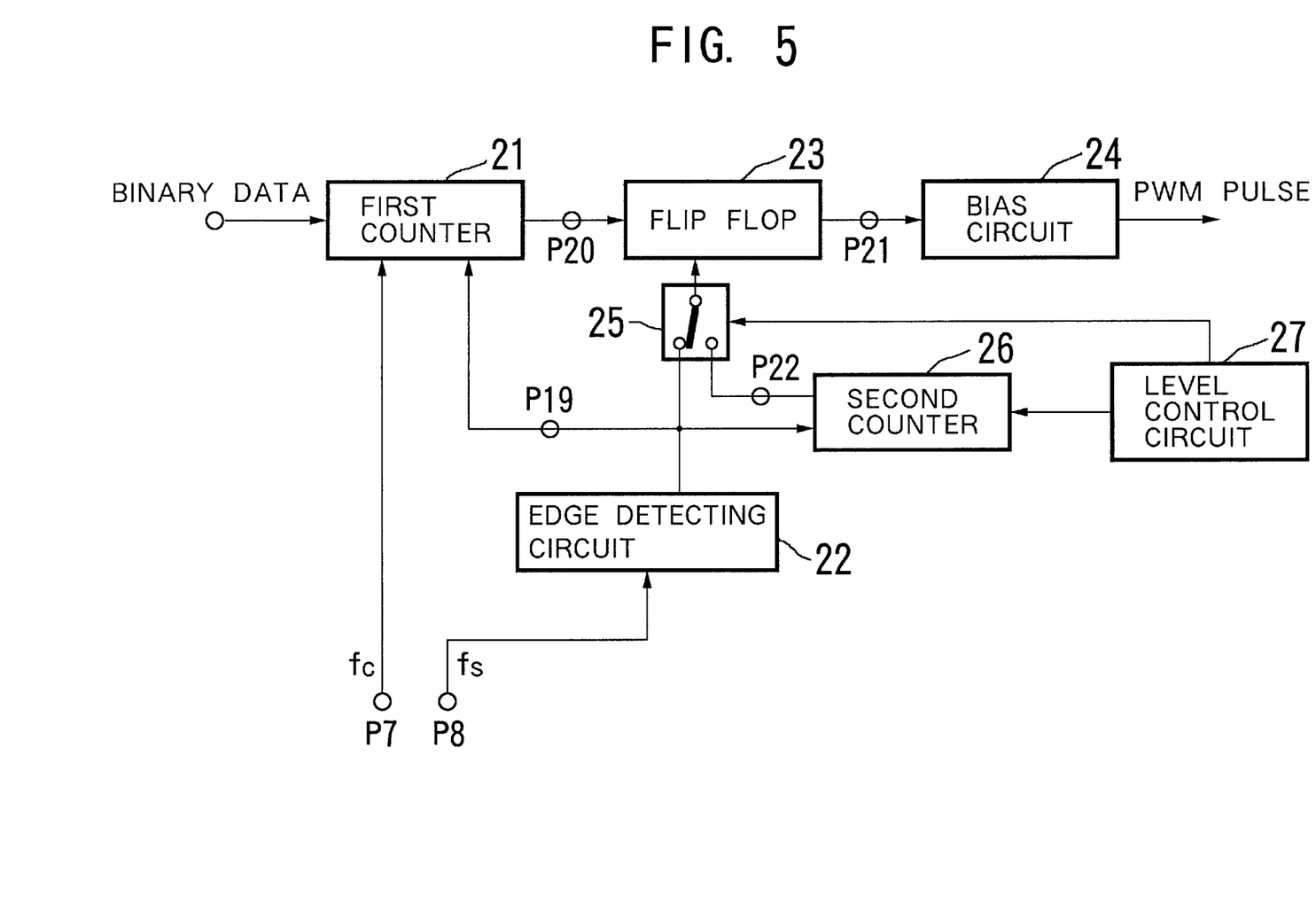
FIG. 5 is a block diagram showing the constitution of a second embodiment of the PWM modulator shown in FIG. 1.

FIG. 5 is a block diagram showing the constitution of the second embodiment of the PWM modulator shown in FIG. 1. FIG. 6 is a timing chart showing the operation mode of the PWM modulator shown in FIG. 5.

In FIG. 5, the PWM modulator of this embodiment comprises a first counter 21 for counting by the counter clock fc output from the clock generator 6; a flip flop 23 for outputting the PWM pulse of the pulse width proportional to the absolute value of the input signal; an edge detecting circuit 22 for outputting the timing pulse for resetting the first counter 21 and setting the flip flop 23; a second counter 26 for outputting the timing pulse, which is later than the timing pulse to be output to the first counter 21, to the flip flop 23; a level control circuit 27 for providing the second counter 26 with the binary data in response to the output amplitude value set by the volume or the like and for controlling a switch as described below; and a switch 25 for outputting either the timing pulse output from the edge detecting circuit 22 or the second counter 26.

In such a constitution, the operation of the PWM modulator of this embodiment will be described below with reference to FIG. 6. The following description is provided for the case in which the switch 25 outputs the timing pulse output from the second counter 26 to the flip flop 23.

Figure 6A:
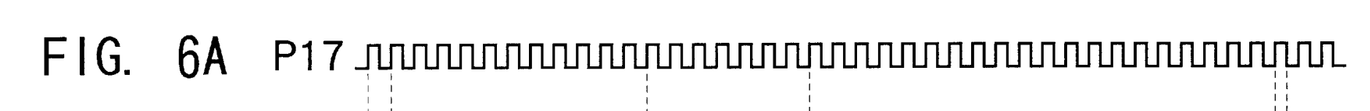
FIGS. 6A–6F is a timing chart showing the operation mode of the PWM modulator shown in FIG. 5.
Figure 6B:
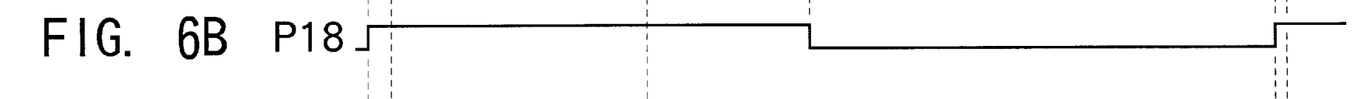
Figure 6C:
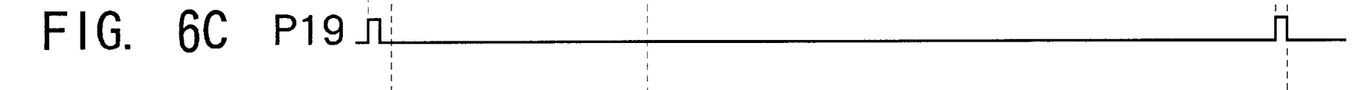
Figure 6D:
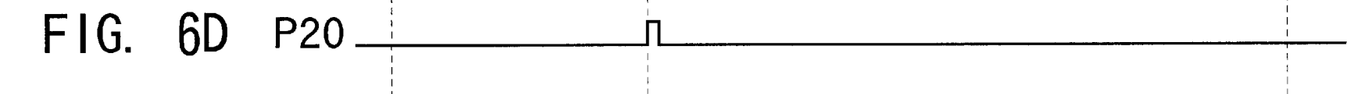
Figure 6E:
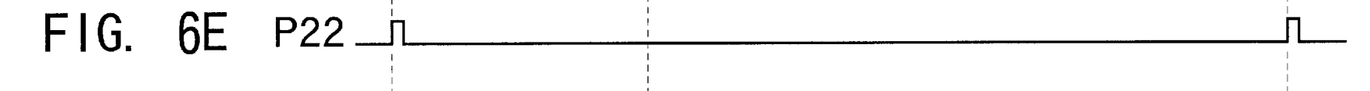

The counter clock fc (P17) shown in FIG. 6(A) is input to the first counter 21. The sampling clock fs (P18) shown in FIG. 6(B) is input to the edge detecting circuit 22. The edge detecting circuit 22 outputs a timing pulse P19 for resetting the first counter 21 in synchronization with the leading edge of the sampling clock fs, as shown in FIG. 6(C). As shown in FIG. 6(D), the first counter 21 counts by the use of the counter clock fc in accordance with the binary data output from the PCM signal processor. Then, as soon as the count is completed, the first counter 21 outputs a counter completion pulse P20. The counting operation is started by inputting the timing pulse P19 output from the edge detecting circuit 22.

The second counter 26 receives the timing pulse P19 output from the edge detecting circuit 22, counts by the value set by the level control circuit 27, and then outputs a timing pulse P22. In this embodiment, when the counter clock fc is counted by one clock, the timing pulse P22 is output.

Figure 6F:
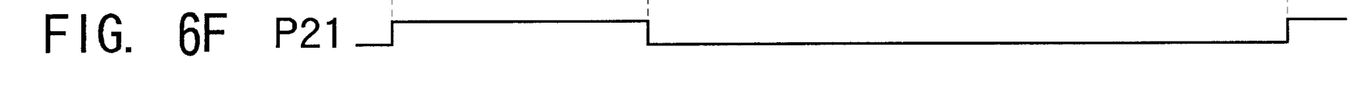

The flip flop 23 sets the data "1" by the timing pulse P22 output from the second counter 26 and resets the data "1" by the count completion pulse P20 output from the first counter 21. Therefore, as shown in FIG. 6(F), the flip flop 23 outputs a PWM pulse P21 having the pulse width from the time of outputting the timing pulse P22 to the time of outputting the count completion pulse P20. This pulse width is proportional to the amplitude of the input signal (PCM data) in one sample cycle.

When the PWM pulse P21 shown in FIG. 6(F) is compared with the PWM pulse P11 shown in FIG. 4(E), the former is shorter than the latter by the pulse width of one cycle of the counter clock fc.

Therefore, since the leading-edge timing of the PWM pulse can be controlled by a bit unit by means of the value which is set by the level control circuit 27, the pulse width of the PWM pulse wave can be changed by the least significant bit of the PCM data. Accordingly, the output level of the PWM driving apparatus can be set by a simple circuit.

The switch 25 is the switch for switching the timing pulse to be supplied to the flip flop 23. By selecting the output from the edge detecting circuit 22, the maximum level proportional to the input signal can be output from the PWM driving apparatus.

Since the present invention is constituted as described above, it has effects as described below.

In the driver according to claim 1, since the PWM pulse wave is not output when no signal is input, the waste of the power can be avoided when no signal is input. Furthermore, since the output has no DC offset, when the speaker or the like is driven, the capacitor for cutting off the direct current is not needed.

Moreover, the driver has switch means, whereby a single PWM modulator can output both of the positive-polarity and negative-polarity PWM pulses, and thus the circuit is simple in constitution.

In the driver according to claim 2, the differential output amplifier can output the PWM pulse wave, whereby the high output level can be obtained. Additionally, since the differential output amplifier performs the switching operation alone, the efficiency is higher than the efficiency in case of processing the analog signal.

In the driver according to claim 3, the driver has the clock generator for providing the PWM modulator with the sampling clock of an optional frequency and the counter clock of the corresponding frequency, whereby the driver can comply with the PCM data of various sampling frequencies and various numbers of quantized bits.

In the driver according to claim 4, since the pulse width of the PWM pulse wave can be varied by the count value which is set by the level control circuit, the duty cycle of the PWM pulse wave can be changed, and thus the output level of the PWM driver can be set by the simple circuit.

What is claimed is:

1. A PWM driver for supplying a power proportional to an input signal to a load by outputting a PWM pulse wave whose duty cycle is changed in proportion to said input signal, said apparatus comprising:

a PWM modulator for outputting a first PWM pulse having a pulse width proportional to an absolute value of said input signal in a predetermined cycle;

an inverting amplifier for outputting a second PWM pulse having a polarity opposite to the polarity of said first PWM pulse;

switch means for outputting said first PWM pulse or said second PWM pulse in response to the polarity of said input signal; and an amplifier for outputting said PWM pulse wave in response to an output pulse of said switch means.

2. The driver according to claim 1, wherein said amplifier is a differential output amplifier for outputting a first PWM pulse wave obtained by non-inverting the output pulse of said switch means and for outputting a second PWM pulse wave obtained by inverting the output pulse of said switch means.

3. The driver according to claim 1 further comprising:

a clock generator for providing said PWM modulator with:

a sampling clock which is set to an optional frequency and is for determining a predetermined cycle; and a counter clock which is set to the frequency in response to the number of quantized bits of said input signal in accordance with the frequency of said sampling clock and is used by counting means for allowing said first PWM pulse to have the pulse width proportional to the absolute value of said input signal.

4. The driver according to claim 1 further comprising:

a counter for outputting a timing pulse for determining a leading-edge timing of said first PWM pulse; and a level control circuit for setting a count value for allowing said counter to output said timing pulse so that said count value may be changeable.

* * * * *